United States Patent
Sung

(10) Patent No.: US 11,506,703 B2
(45) Date of Patent: Nov. 22, 2022

(54) APPARATUS AND METHOD AND COMPUTER PROGRAM PRODUCT FOR VERIFYING MEMORY INTERFACE

(71) Applicant: SILICON MOTION, INC., Zhubei (TW)

(72) Inventor: Wei-Liang Sung, Miaoli County (TW)

(73) Assignee: SILICON MOTION, INC., Zhubei (TW)

( * ) Notice: Subject to any disclaimer, the term of this patent is extended or adjusted under 35 U.S.C. 154(b) by 644 days.

(21) Appl. No.: 16/548,463

(22) Filed: Aug. 22, 2019

(65) Prior Publication Data

US 2020/0256913 A1  Aug. 13, 2020

Related U.S. Application Data

(60) Provisional application No. 62/804,999, filed on Feb. 13, 2019.

(30) Foreign Application Priority Data

May 21, 2019  (CN) .......................... 201910423599.2

(51) Int. Cl.
  *G01R 31/28* (2006.01)
  *G11C 11/412* (2006.01)
  *G06F 3/06* (2006.01)
(52) U.S. Cl.
  CPC ....... *G01R 31/2815* (2013.01); *G06F 3/0607* (2013.01); *G06F 3/0658* (2013.01); *G06F 3/0679* (2013.01); *G11C 11/4125* (2013.01)
(58) Field of Classification Search
  CPC . G01R 31/2815; G06F 3/0607; G06F 3/0658; G06F 3/0679; G11C 11/4125

USPC ........ 714/718, 721, 723, 734, 702; 324/538, 324/537, 750.01, 750.3, 756.02, 756.05, 324/763.01

See application file for complete search history.

(56) References Cited

U.S. PATENT DOCUMENTS

| | | | |
|---|---|---|---|
| 5,416,908 A * | 5/1995 | DiCarlo | G05B 19/054 714/E11.019 |
| 6,550,033 B1 * | 4/2003 | Dwork | G01R 31/3187 714/733 |
| 6,615,378 B1 * | 9/2003 | Dwork | G01R 31/3187 254/134.3 FT |

(Continued)

OTHER PUBLICATIONS

Taiwanese Search Report dated Apr. 17, 2020, for corresponding Taiwanese Application No. 108117397.

*Primary Examiner* — John J Tabone, Jr.
(74) *Attorney, Agent, or Firm* — Birch, Stewart, Kolasch & Birch, LLP

(57) ABSTRACT

The invention introduces a method for verifying memory interface, performed by a processing unit, to include: driving a physical layer of a memory interface to pull-high or pull-low a signal voltage on each Input-Output (IO) pin thereof to a preset level according to a setting; obtaining a verification result corresponding to each IO pin from the memory interface; and storing each verification result in a static random access memory (SRAM), thereby enabling a testing host to obtain each verification result of the SRAM through a test interface. The testing host may examine each verification result to know whether any unexpected error has occurred in signals on the IO pins of the memory interface.

20 Claims, 8 Drawing Sheets

(56) References Cited

U.S. PATENT DOCUMENTS

| | | | |
|---|---|---|---|
| 6,813,739 B1* | 11/2004 | Grannis, III | G01R 31/318572 |
| | | | 714/E11.16 |
| 2006/0182151 A1* | 8/2006 | Ramsdale | G06F 13/409 |
| | | | 370/522 |
| 2006/0242487 A1 | 10/2006 | Baeg et al. | |
| 2007/0216438 A1* | 9/2007 | Gupta | G11C 29/56 |
| | | | 324/762.02 |
| 2013/0342236 A1 | 12/2013 | Song et al. | |
| 2016/0179388 A1* | 6/2016 | Huang | G06F 13/1668 |
| | | | 711/104 |

* cited by examiner

APPARATUS AND METHOD AND COMPUTER PROGRAM PRODUCT FOR VERIFYING MEMORY INTERFACE

CROSS-REFERENCE TO RELATED APPLICATIONS

This application claims the benefit of priority to U.S. Provisional Application Ser. No. 62/804,999, filed on Feb. 13, 2019; and Patent Application No. 201910423599.2, filed in China on May 21, 2019; the entirety of which is incorporated herein by reference for all purposes.

BACKGROUND

The disclosure generally relates to storage device and, more particularly, to apparatuses and methods and computer program products for verifying memory interface.

With the increased demand for increased storage space and miniaturization in memory devices, such as dynamic random access memory (DRAM), flash memory, etc., memory manufacturers enhance chip performance without sacrificing valuable board real estate. Rather than using conventional single chip or multiple-chip type packaging, multiple die stacking solutions are utilized by chip designers. Stacking of dies, such as multiple memory chips, not only provides a reduction in overall package footprint, but a substantial improvement in electrical performance through quicker transmissions requiring less energy to drive the signals. Wire bonding for stacked dies makes interconnections between stacked memory chips and a printed circuit board (PCB), thereby enabling a controller to couple or connect to the memory chips through the PCB. However, with the increased number of stacked dies, especially more than two dies, manufacturing defects may occur within the interconnections more frequently, in the worst case, making the interface between the memory device and the controller malfunctions. Thus, it is desirable to have apparatuses, methods and computer program products for verifying memory interface to find electronic devices equipped with failed interface before leaving the factory.

SUMMARY

In an aspect of the invention, a method for verifying memory interface, performed by a processing unit, is introduced to comprise: driving a physical layer (PHY) of a memory interface (I/F) to pull-high or pull-low a signal voltage at every Input-Output (IO) pin that is connected to a memory device to a predefined level according to a setting; obtaining a test result corresponding to every IO pin from the memory I/F; and storing the test result corresponding to every IO pin in a static random access memory (SRAM), thereby enabling a test host to obtain the test result for each IO pin from the SRAM through a test I/F. The processing unit is coupled to the memory I/F, the SRAM and the test I/F.

In another aspect of the invention, a non-transitory computer program product for verifying memory interface is introduced to comprise program code. The program code when been loaded and executed by a processing unit performs the above method.

In another aspect of the invention, an apparatus for verifying memory interface is introduced to comprise the memory I/F; the test I/F; and the processing unit. The processing unit is arranged to operably perform operations of the above method.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
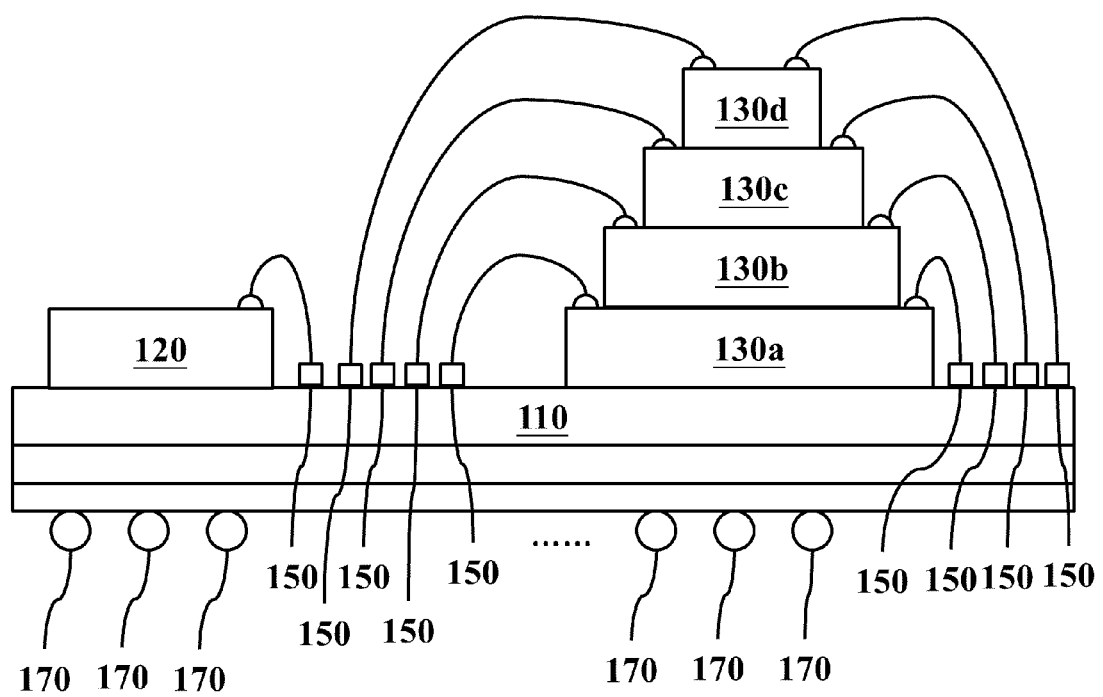
FIG. 1 is a sectional diagram illustrating correct wire-bondings for a memory device.

In order to reduce space of a printed circuit board (PCB), multiple dies may be stacked on a substrate, connected to circuits of the substrate by wire bonding, and packaged into a memory chip. After that, the memory chip is disposed on the PCB and connected to circuits of the PCB. Refer to correct wire-bondings as shown in FIG. 1. A memory device may include multiple dies 130a to 130d. A substrate 110 may include multiple layers, the top surface of the uppermost layer may include multiple exposed fingers 150 and the bottom surface of the lowermost layer may include multiple exposed solder balls 170. A die 120 may include Integrated Circuit (IC) of a controller for providing the functionality of a processing unit, a PHYsical layer (PHY), a Medium Access Control (MAC) layer, or any combinations thereof. Multiple pads are exposed on the die 120 and each pad is connected to one finger 50 of the substrate 110 by a wire. The dies 130a to 130d may include IC of the memory chip and the dies 130a to 130d may be stacked on the substrate 110. The memory chip may be a Dynamic Random Access Memory (DRAM) chip, a NAND flash chip, a NOR flash chip, or others. The dies 130a to 130d may be referred to as the first- to fourth-layer dies from bottom to top. Multiple pads are exposed on the dies 130a to 130d. A wire bonding machine connects each pad on the dies 120, and 130a to 130d to one finger 150 on the substrate 110.

Figure 2:
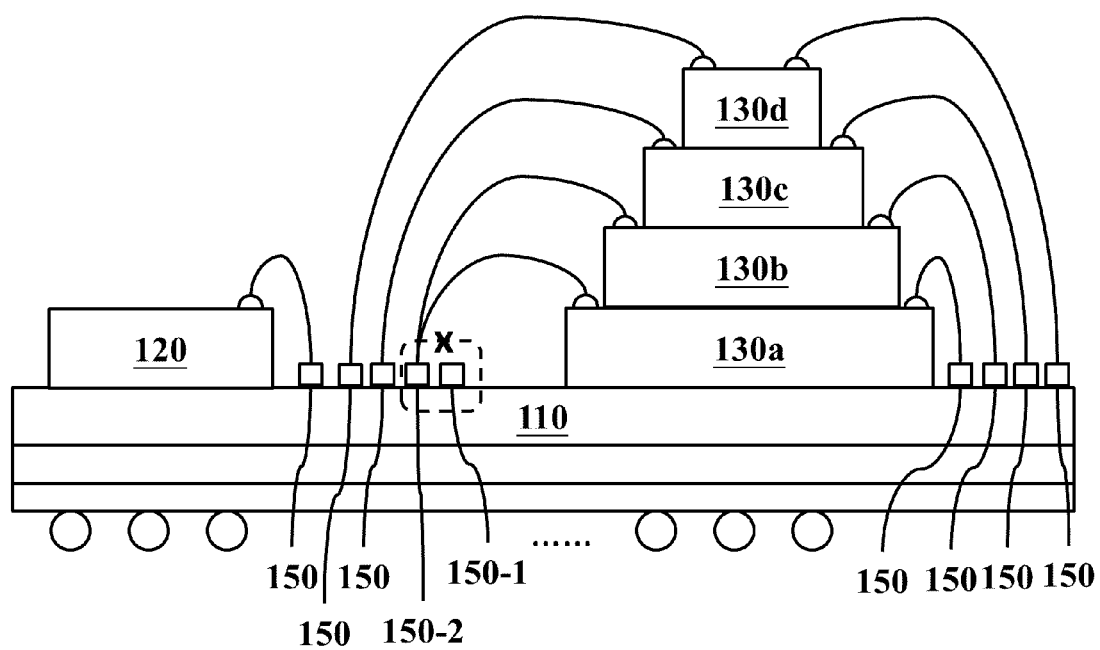
FIG. 2 is a sectional diagram illustrating an incorrect wire-bonding for a memory device.

However, an incorrect wire-bonding causes not only signal errors but, even worse, the malfunction of the memory chip. Refer to an incorrect wire-boding as shown in FIG. 2. The left pad on the die 130a is expected to connect to the finger 150-1 but mistakenly connected to the finger 150-2. It may cause erroneous operations with at least one Input-Output (IO) port, or in the worst case, a crash of the interface between the controller and the system device.

Figure 3:
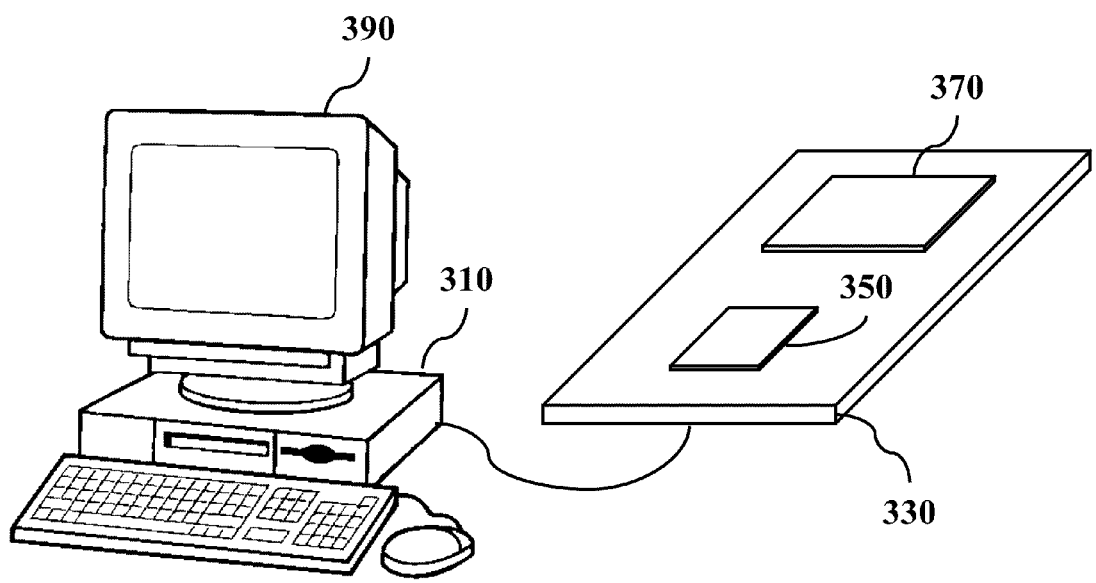
FIG. 3 is a schematic diagram of a verification system according to an embodiment of the invention.

Refer to FIG. 3. A controller 350 and a memory device 370 may be mounted on a PCB 330 to form a data storage device, and the controller 350 is coupled or connected to the memory device 370 via the PCB 330. The memory device 370 may be a DRAM chip, a NAND flash chip, a NOR flash chip, or others. In a typical case, the data storage device has only one memory controller 350 with one or more memory devices 370, such as two NAND flash chips, or one NAND flash chip and one DRAM chip.

In order to ensure that the data storage device works regularly, a test host 110, being coupled or connected to the data storage device, issues a command to request the memory controller 350 to perform a memory-interface verification method and in turn reads test results from the memory controller 350, so as to display the test results on a displayer 390. Therefore, a test engineer may determine whether the connections between the memory controller 350 and the memory device 370 are correct according to the test results. When the connections between the memory controller 350 and the memory device 370 are incorrect, the test engineer may mark the PCB 330, the memory controller 350 and the memory device 370 as defective products, or unmount the memory device 370 to conduct a further study to know the causes. Or, the test host 310 may drive a robot arm (not shown in FIG. 3) to unmount the incorrect memory device 370 from the PCB 330, mount another memory device on the PCB 330 and test if the interface between the memory interface 350 and the new memory device operates regularly.

Figure 4:
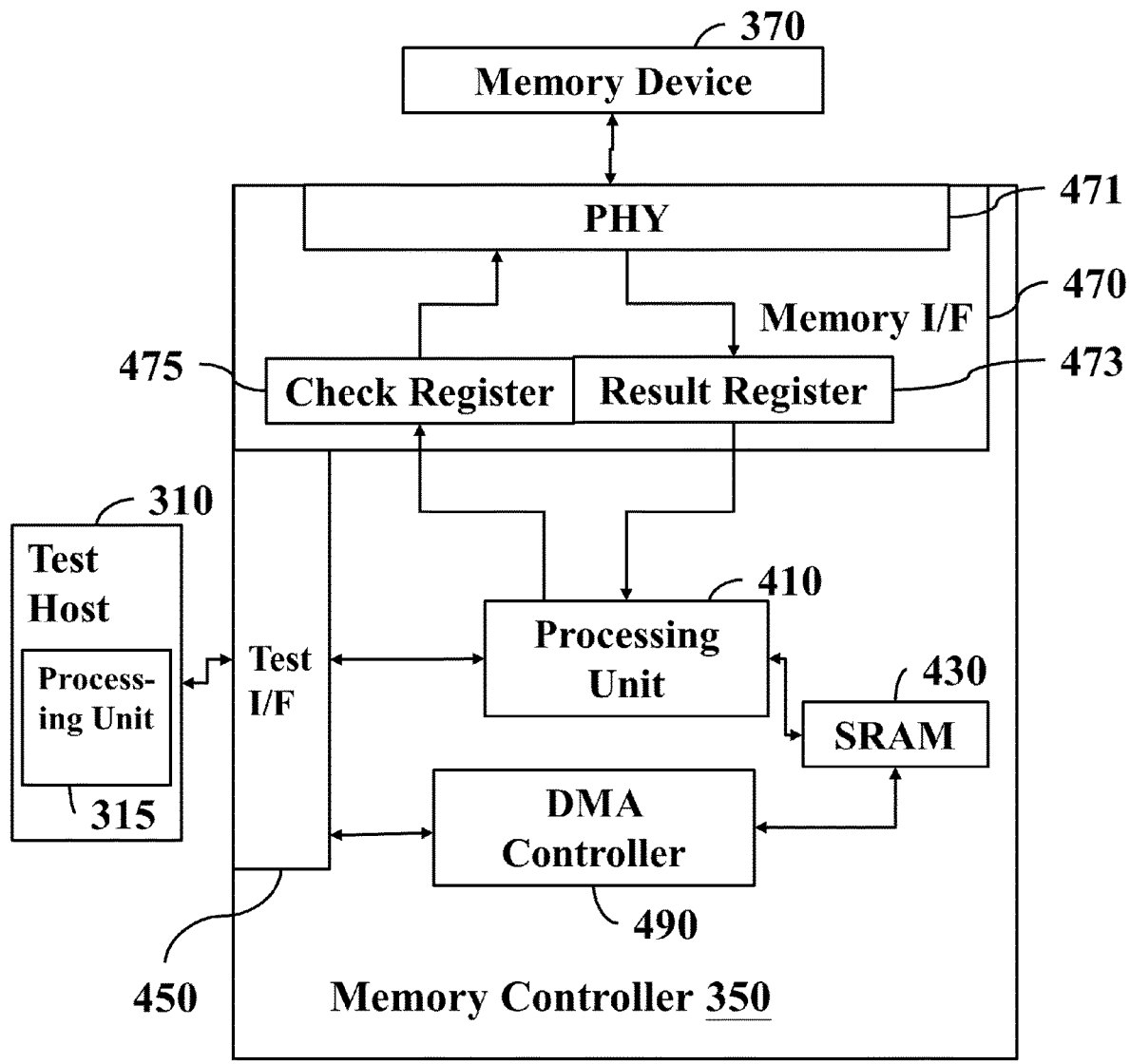
FIG. 4 is a block diagram of a verification system according to an embodiment of the invention.

Refer to FIG. 4. The memory controller 350 may include a processing unit 410 that may be implemented in numerous ways, such as with general-purpose hardware (e.g., a single processor, multiple processors or graphics processing units capable of parallel computations, or others) that is programmed using firmware or software instructions of Mass Production Integrated System Program (MPISP) to perform the functions recited herein. The memory controller 350 may include a test interface (I/F) 450, such as Serial Advanced Technology Attachment (SATA) or Peripheral Component Interconnect Express (PCIE) interface, that permits the test host 310 to issue commands therethrough to the processing unit 410 for activating executions of the verification methods. After the tests have been performed completely, the test host 310 may request a Direct Memory Access (DMA) controller 490 through the test I/F 450 to read test results from a predefined region of a Static Random Access Memory (SRAM) 430. In alternative embodiments, after the tests have been performed completely, the memory controller 350 may feedback the test results to the test host 310 through the test I/F 450 directly. The MPISP may be stored in a Read Only Memory (ROM, not shown in FIG. 4) of the memory controller 450 before leaving a factory, or transmitted from the test host 310 to the memory controller 350 through the test I/F 450 or others before a start of the tests.

In some embodiments, the memory device 370 may be a NAND flash providing huge storage space typically in Gigabytes, or even Terabytes, for storing a wide range of user data, such as high-resolution images, video files, etc. Memory cells of the NAND flash may be Triple Level Cells (TLCs) or Quad-Level Cells (QLCs). The memory I/F 470 may communicate with the NAND flash using a Double Data Rate (DDR) protocol, such as Open NAND Flash Interface (ONFI) Sync, ONFI Async, DDR toggle, etc. The IO signals between the memory I/F 470 and the NAND flash may include Data[7:0], CE #, ALE, CLE, RE #, RE_c, WE #, WP #, DQS_c, DQS #, ZQ, Data[15:8], and so on.

In some embodiments, the memory device 370 may be a DRAM for buffering data required in executions of software and firmware instructions, such as variables, data tables, etc., and a wide range of user data. The memory I/F 470 may communicate with the DRAM using a DDR protocol, such as DDR3, Low Power DDR3 (LPDDR3), DDR4, etc. The IO signals between the memory I/F 470 and the DRAM may include reset, CK, CK_N, CKE, ODT, CS_N, ACT_N, BG, BA, A, DM, DQS, DQS_N, DQ_lower, DQ_upper, and so on.

The memory interface (I/F) 470 may include a Physical layer (PHY) 471 composed of circuits for connecting to the memory device 370. The memory controller 350 employs the DDR protocol and communicates with the memory device 370 through the PHY 471, including sending commands, addresses, data and others to the memory device 370, and receiving data, addresses, messages and others from the memory device 370. The memory I/F 470 may include a check register 475 for storing multi-bit data, a total amount of bits is equal to or greater than a total amount of IO pins that the memory I/F 470 is connected to, and each bit is associated with one IO pin that the memory I/F 470 is connected to. The processing unit 410 may set the check register 450 to instruct the PHY 471 how to perform the interface test between the memory controller 350 and the memory device 370. One bit of the check register 475 being set to "1" represents that the processing unit 410 instructs the PHY 471 to make the signal voltage at the designated IO pin pull high. Otherwise represents that the processing unit 410 instructs the PHY 471 to make the signal voltage at the designated IO pin pull low. The PHY 471 may include voltage measurement circuits for determining whether the signal voltage at the designated IO pin has reached the ideal level, such as the HIGH state or the LOW state. The memory I/F 470 may include a result register 473 for storing multi-bit data, a total amount of bits is equal to or greater than a total amount of IO pins that the memory I/F 470 is connected to, and each bit is associated with one IO pin that the memory I/F 470 is connected to. One bit of the result register 473 being set to "1" represents that the signal voltage at the designated IO pin is not qualified and an erroneous wire-bonding as shown in FIG. 2, or other manufacturing defects may occur. Otherwise represents that the signal voltage at the designated IO pin is qualified. The processing unit 410 may store the value of the result register 473 in a designated region of the SRAM 430 after the PHY 471 has finished the signal voltage measurement, thereby enabling the test host 310 to obtain the test results through the test I/F 450 and the DMA controller 490. Although the embodiments describe two registers 473 and 475 in use, those artisans may devise the architecture of FIG. 4 to combine the two registers 473 and 475 into one. Detailed operations are described as follows: The processing unit 410 may set the combined register to instruct the PHY 471 how to perform the interface test between the memory controller 350 and the memory device 370 first. After the interface test for one IO pin has finished according to a setting of a corresponding bit of the combined register, the PHY 471 writes a test result into the corresponding bit of the combined register. Thereafter, the processing unit 410 may read the test results from the combined register.

Figure 5:
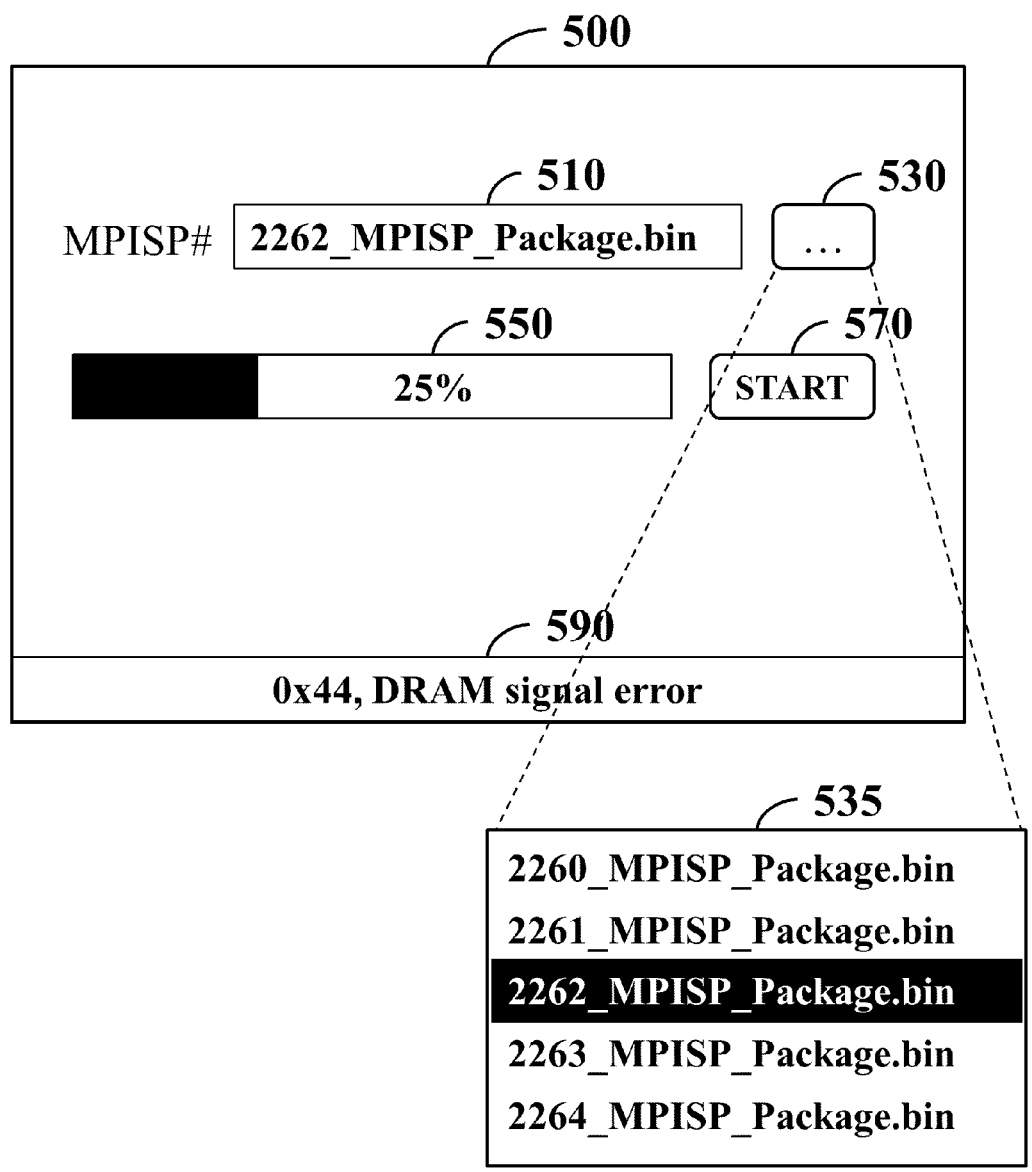
FIG. 5 is a Graphical User Interface (GUI) for verifying a memory interface (I/F) according to an embodiment of the invention.

The processing unit 315 of the test host 310 may execute a test tool providing a Man-Machine Interface (MMI) to facilitate the memory I/F tests by an engineer. The displayer 390 displays a Graphical User Interface (GUI) 500 as shown in FIG. 5 for verifying memory I/F. The test GUI 500 may provide a selection button 530. When the selection button 530 is clicked by a user, the processing unit 315 may execute On_click( ) event handler of the selection button 530 to display a selection menu 535 including items on the displayer 390, in which each item is associated with one MPISP stored in the ROM of the memory controller 350, such as NAND Flash, NOR Flash or DRAM MPISP. A display box 510 may display the determined MPISP reflecting a manipulation to the selection menu 535 by a user. The test GUI 500 may further provide a start button 570. When the start button 570 is clicked by a user, the processing unit 315 of the test host 310 may execute On_click( ) event handler of the start button 570 to instruct the processing unit 410 of the memory controller 350 through the test I/F 450 to load and execute the determined MPISP. The test host 310 may continuously obtain test results of the memory I/F 470 through the test I/F 450 and the DMA controller 490 and modify the content of the test progress box 550 and the calibration message box 590 accordingly.

Figure 6:
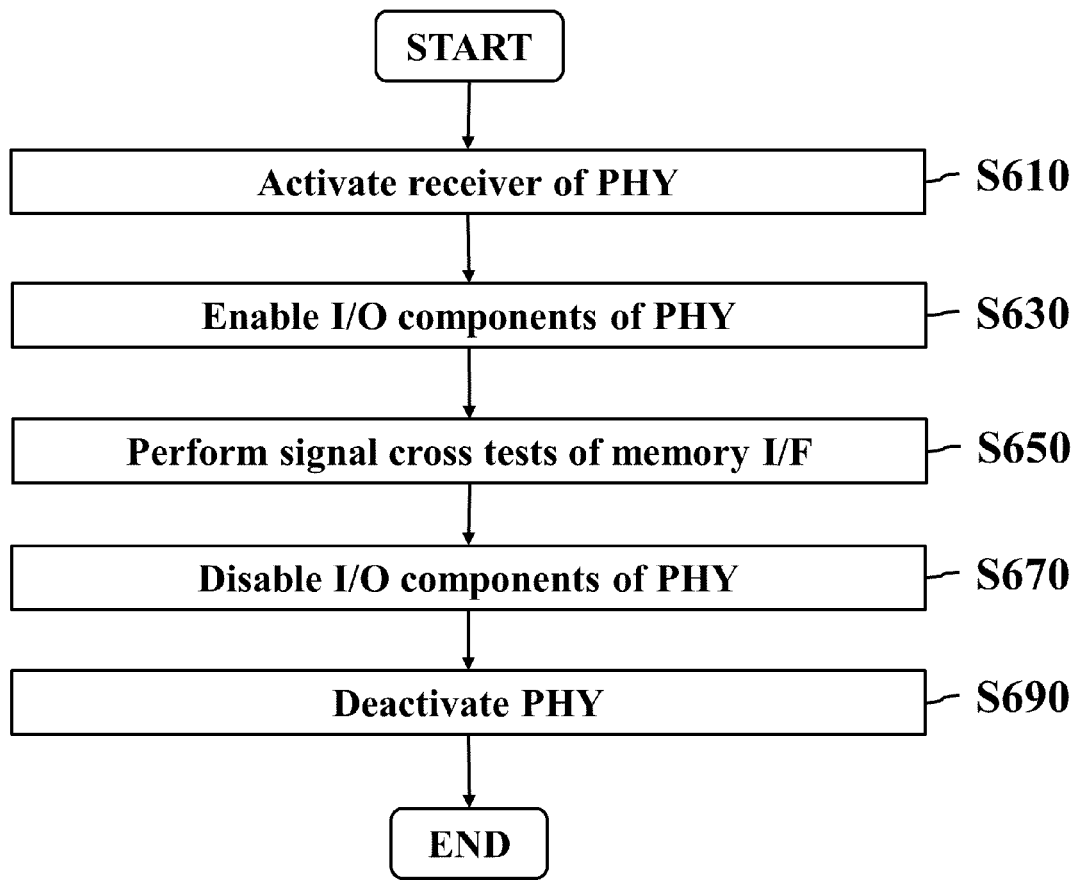
FIG. 6 is a flowchart illustrating a method for verifying a memory I/F according to an embodiment of the invention.

The processing unit 410 when loading and executing the designated MPISP may realize the process flow illustrated in FIG. 6. Before the memory device 370 is initiated, the processing unit 410 may activate a receiver of the PHY 471 by setting relevant registers (step S610). For example, the processing unit 410 may execute instructions of the function CLR_DRAM_PD_RX( ) to set the registers related to signals, such as CE, CKE, ODT, CK, Reset signals, etc., for activating the receiver of the PHY 471. Then, the processing unit 410 may enable every IO component of the PHY 471, such as transceiver, etc., by setting relevant registers (step S630). For example, the processing unit 410 may execute instructions of the function DRAM_SIGNAL_ENABLE( ) to activate every IO component of the PHY 471. After activating the receiver of the PHY 471 and enabling every IO component of the PHY 471, the processing unit 410 may perform signal cross tests of the memory I/F 470 (step S650). For example, the processing unit 410 may execute instructions of the function DRAMSignalCrossTest( ) to realize the signal cross tests of the memory I/F 470. After the signal cross tests of the memory I/F 470 have completed, the processing unit 470 may disable the IO components of the PHY 470 and deactivate the PHY 470 by setting relevant registers (steps S670 and S690). For example, the processing unit 410 may execute instructions of the functions DRAM_SIGNAL_DISABLE( ) and SET_DRAM_PD_ RX( ) to disable the IO components of the PHY 471 and deactivate the PHY 470, respectively.

Figure 7:
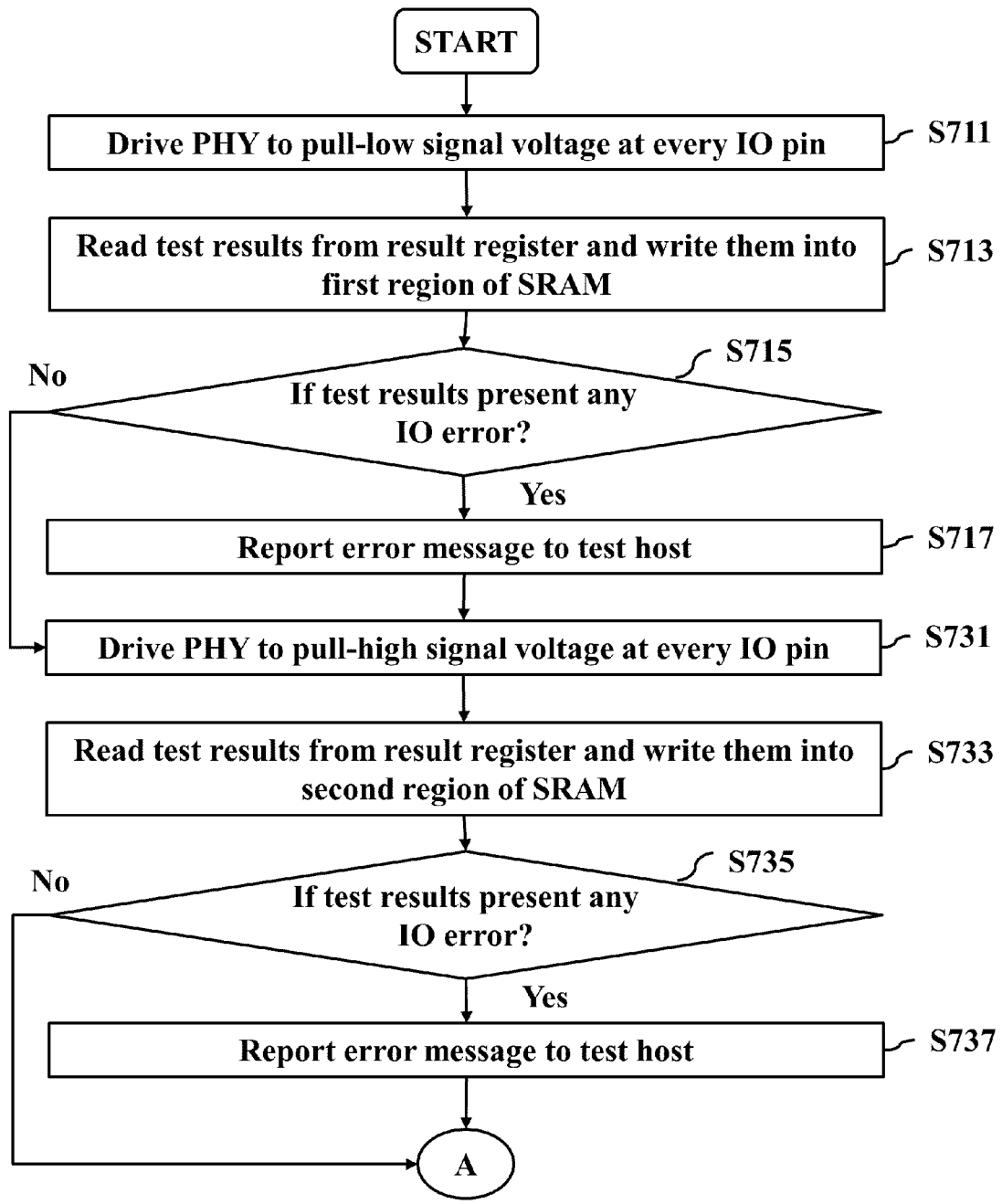
FIGS. 7 and 8 are flowcharts illustrating a method of signal cross tests according to an embodiment of the invention.
Figure 8:
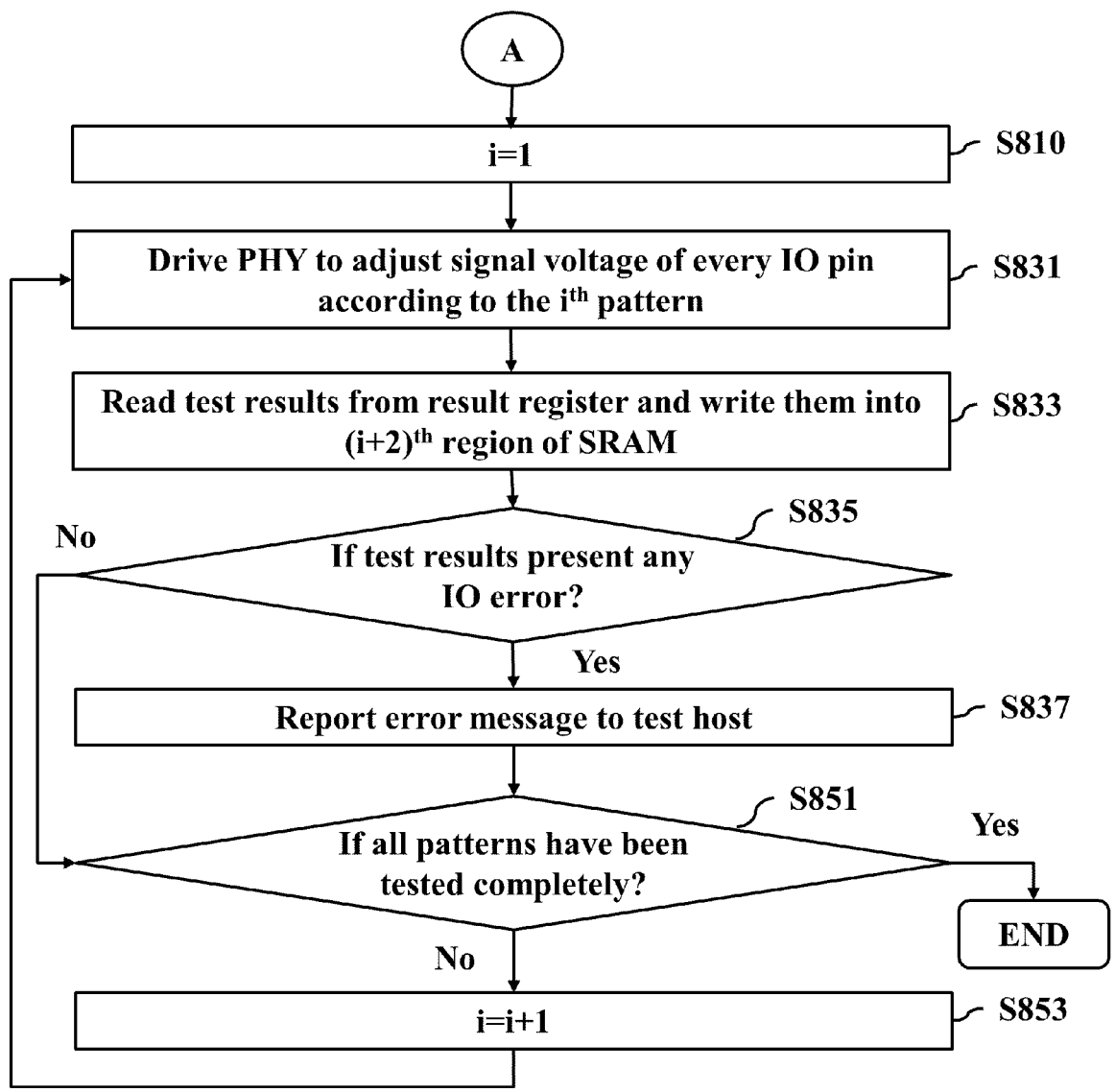

Details of the signal cross tests of the memory I/F 470 recited in step S650 may refer to the flowcharts illustrated in FIGS. 7 and 8. The whole signal cross tests may be conceptually divided into three phases: short to VCC check; short to GND check; and signal shorted check. The order of the three phases can be modified depending on different design requirements and may not strictly follow the sequential relations in time as shown in FIGS. 7 and 8. In each phase, the processing unit 410 drives the PHY 471 of the memory I/F 470 to pull-high or pull-low a signal voltage at each IO pin that is connected to the memory device 370 to a predefined level according to a setting; obtains a test result corresponding to each IO pin from the memory I/F 470; and stores the test result corresponding to each IO pin in the SRAM 430, thereby enabling the test host 310 to obtain the test result corresponding to each IO pin from the SRAM 430 through the test I/F 450. The test host 310 can discover whether unexpected signal errors have occurred at the IO pins of the memory I/F 470 according to the test results.

The phase of short to VCC check may include steps S711 to S717 recited in FIG. 7 for inspecting whether a signal voltage at each IO pin of the memory I/F 470 can be pull-low to a predefined level. The processing unit 410 may set every bit of the check register 475 to "0" for driving the PHY 471 to pull-low a signal voltage at every IO pin (step S711), read test results corresponding to all IO pins from the result register 473 and write them into a first region of the SRAM 430 (step S713), and determine whether the test results present any IO error (step S715). In alternative embodiments that the check register 475 and the result register 473 are combined into a single register, the processing unit 410 may write all "0" into the single register through hardware direct bus and read every bit value (that is, a test result) of the single register through the hardware direct bus. In step S715, the processing unit 410 may determine the value of the result register 473 include all "0". If not, the test results present one or more IO errors. When the test results present any IO error (the "Yes" path of step S715), an error message (such as the error code "0x44") is reported to the test host 310 through the test I/F 450 (step S717).

The phase of short to GND check may include steps S731 to S737 recited in FIG. 7 for inspecting whether a signal voltage at each IO pin of the memory I/F 470 can be pull-high to a predefined level. The processing unit 410 may set every bit of the check register 475 to "1" for driving the PHY 471 to pull-high a signal voltage at every IO pin (step S731), read test results corresponding to all IO pins from the result register 473 and write them into a second region of the SRAM 430 (step S733), and determine whether the test results present any IO error (step S735). Details of step S731, S733, S735 and S737 may be inferred from the descriptions of steps S711, S713, S715 and S717, and are omitted herein for brevity.

The phase of signal shorted check may include steps S810 to S853 recited in FIG. 8 for inspecting whether the memory I/F 470 can pass the test of every pattern. When the memory I/F 470 cannot pass the test of a particular pattern, the test host 310 may analyze the test results to discover whether any short has occurred between signals, and perform an error correction operation accordingly. For example, 64 patterns, such as "0x0000000000000001", "0x0000000000000002", "0x0000000000000004", "0x0000000000000008", "0x0000000000000010", "0x0000000000000020" to "0x8000000000000000", can be defined for the memory I/F 470 having 64 IO pins. 64 successive regions (8 bytes are included in every region) following the second region of the SRAM 430 may be allocated for storing test results of the 64 patterns.

Specifically, this phase begins to set the variable i to 1 (step S810). Next, a loop is repeatedly executed (steps S831 to S853) until all patterns have been tested (the "Yes" path of step S851). In each iteration, the processing unit 410 may write the $i^{th}$ pattern into the check register 475 to drive the PHY 471 to adjust a signal voltage of every IO pin according to the $i^{th}$ pattern (step S831), read test results from the result register 473 and write them into the $(i+2)^{th}$ region of the SRAM 430 (step S833) and determine whether the test results present any IO error (step S835). Details of step S831, S833, S835 and S837 may be inferred from the descriptions of steps S711, S713, S715 and S717, and are omitted herein for brevity. The processing unit 410 may further determine whether all patterns have been tested completely (step S851). If so (the "Yes" path of step S851), then the phase of signal shorted check ends. Otherwise (the "No" path of step S851), the process increases the variable i by 1 (step S853) and goes to the next iteration.

In some embodiments, the PHY 471 may include 19 or 27 IO pins connected to a NAND flash. The check register 475 and the result register 473 may individually store data of 32 bits (or one Double Word DWORD). Table 1 shows exemplary definitions and bit positions of test results for IO pins:

TABLE 1

| Pin Number | ONFI (Async) | Toggle | ONFI (Sync) | Bit Position of Test Result |
|---|---|---|---|---|
| 0-7 | Data[7:0] | Data[7:0] | Data[7:0] | [7:0] |
| 8 | CE# | CE# | CE# | [8] |
| 9 | ALE | ALE | ALE | [9] |
| 10 | CLE | CLE | CLE | [10] |
| 11 | RE# | RE# | R/W | [11] |
| 12 | RE_c | RE_c | RE_c | [12] |
| 13 | WE# | WE# | Clock | [13] |
| 14 | R/B# | R/B# | R/B# | [14] |
| 15 | WP# | WP# | WP# | [15] |
| 16 | DQS_c | DQS_c | DQS_c | [16] |
| 17 | DQS# | DQS# | DQS# | [17] |
| 18 | ZQ | ZQ | ZQ | [18] |
| 19-26 | Reserved | Reserved | Data[15:8] | [19:26] |

For example, the pin #8 carries the CE #signal. The processing unit 410 may set the $8^{th}$ bit of the check register 475 to define its test type, read the $8^{th}$ bit of the result register 473 to obtain its test result and store its test result in the $8^{th}$ bit of the designated region of the SRAM 430. Similar technology details for the other pins can be inferred from the above descriptions and are omitted herein for brevity.

In some embodiments, the PHY 471 may include 128 IO pins connected to a DRAM. The check register 475 and the result register 473 may individually store data of 128 bits (or two Quadruple Word QWORD). Table 2 shows exemplary definitions and bit positions of test results for IO pins:

TABLE 2

| Pin Number | DDR | QWORD Number | Bit Position of Test Result |
|---|---|---|---|
| 0 | RAM_RST_N | 1 | [0] |
| 1 | CK | 1 | [1] |
| 2 | CK_N | 1 | [2] |
| 3-4 | CKE | 1 | [4:3] |
| 5-6 | ODT | 1 | [6:5] |
| 7-8 | CS_N | 1 | [8:7] |
| 9 | ACT_N | 1 | [9] |

TABLE 2-continued

| Pin Number | DDR | QWORD Number | Bit Position of Test Result |
|---|---|---|---|
| 10 | BG | 1 | [10] |
| 11-12 | BA | 1 | [12:11] |
| 13-30 | A | 1 | [30:13] |
| 31-34 | DM | 1 | [34:31] |
| 35-38 | DQS | 1 | [38:35] |
| 39-42 | DQS_N | 1 | [42:39] |
| 43-63 | Reserved | 1 | [63:43] |
| 64-79 | DQ_lower | 2 | [15:0] |
| 80-95 | DQ_upper | 2 | [31:16] |
| 96-127 | Reserved | 2 | [63:32] |

For example, the pin #0 carries the RAM_RST_n signal. The processing unit 410 may set the $0^{th}$ bit of the check register 475 to define its test type, read the $0^{th}$ bit of the result register 473 to obtain its test result and store its test result in the $0^{th}$ bit of the $1^{st}$ QWORD of the designated region of the SRAM 430. Similar technology details for the other pins can be inferred from the above descriptions and are omitted herein for brevity.

The following provides use cases illustrating results for testing the DRAM memory interface 470 and describes technical effects of the memory-interface verification method. Table 3 shows exemplary space allocation of the SRAM 430:

TABLE 3

| Offset | Phase | Bitmap location |
|---|---|---|
| 0x800 | Short to VCC check | QWORD1 |
| 0x808 | Short to VCC check | QWORD2 |
| 0x810 | Short to GND check | QWORD1 |
| 0x818 | Short to GND check | QWORD2 |
| 0x820 | $1^{st}$ pattern of signal shorted check | QWORD1 |
| 0x828 | $1^{st}$ pattern of signal shorted check | QWORD2 |
| . | . | . |
| . | . | . |
| . | . | . |
| 0x1010 | $128^{th}$ pattern of signal shorted check | QWORD1 |
| 0x1018 | $128^{th}$ pattern of signal shorted check | QWORD2 |

The test results generated in each phase may be organized in a bitmap and each bit of the bitmap indicates whether an error has occurred at a corresponding pin of the memory I/F. The 8-byte space of addresses 0x800 to 0x807 of the SRAM 430 may be used to store test results of the short-to-VCC check phase for DRAM pins #0-63, and the 8-byte space of addresses 0x808 to 0x80F of the SRAM 430 may be used to store test results of the short-to-VCC check phase for DRAM pins #64-127. The 8-byte space of addresses 0x810 to 0x817 of the SRAM 430 may be used to store test results of the short-to-GND check phase for DRAM pins #0-63, and the 8-byte space of addresses 0x818 to 0x81F of the SRAM 430 may be used to store test results of the short-to-GND check phase for DRAM pins #64-127. The 8-byte space of addresses 0x820 to 0x827 of the SRAM 430 may be used to store test results of the $1^{st}$ pattern of the signal-shorted check phase for DRAM pins #0-63, and the 8-byte space of addresses 0x828 to 0x82F of the SRAM 430 may be used to store test results of the $1^{st}$ pattern of the signal-shorted check phase for DRAM pins #64-127. Space allocation for the rest can be inferred from the above descriptions and is omitted herein for brevity.

For example, when the addresses 0x800 to 0x80F of the SRAM 430 store the bitmap "0x00010000100000000000000000000000", the test host 310 knows that the pins for transmitting the signals DQS[1] and CS_N[1] may be shorted to VCC with references made to Tables 2 and 3. When the addresses 0x810 to 0x81F of the SRAM 430 store the bitmap "0x00000000000400000000000000000000", the test host 310 knows that the pin for transmitting the signal DQS_N[3] may be shorted to GND with references made to Tables 2 and 3. When the addresses 0x820 to 0x82F of the SRAM 430 store the bitmap "0x02000000000000000000200000000000", the test host 310 knows that the pins for transmitting the signals CK and DQ[29] may be shorted to a terminal with references made to Tables 2 and 3.

Some or all of the aforementioned embodiments of the method of the invention may be implemented in a computer program such as an operating system for a computer, a driver for a dedicated hardware of a computer, or a software application program. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data medium, such as a DVD, CD-ROM, USB stick, a hard disk etc., which may be located in a network server accessible via a network such as the Internet, or any other suitable carrier.

The computer program may be advantageously stored on computation equipment, such as a computer, a notebook computer, a tablet PC, a mobile phone, a digital camera, a consumer electronic equipment, or others, such that the user of the computation equipment benefits from the aforementioned embodiments of methods implemented by the computer program when running on the computation equipment. Such the computation equipment may be connected to peripheral devices for registering user actions such as a computer mouse, a keyboard, a touch-sensitive screen or pad and so on.

Although the embodiment has been described as having specific elements in FIG. 4, it should be noted that additional elements may be included to achieve better performance without departing from the spirit of the invention. Each element of FIG. 4 is composed of various circuits and arranged to operably perform the aforementioned operations. While the process flows described in FIGS. 6-8 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for verifying a memory interface, performed by a processing unit when loading and executing program codes of a software or/and a firmware module, which are stored on a non-transitory computer-readable storage medium, wherein the processing unit is coupled to the memory interface (I/F), a static random access memory (SRAM) and a test I/F, the method comprising:
   storing a setting to a first register of the memory I/F to drive a physical layer (PHY) of the memory I/F to pull-high or pull-low a signal voltage at every Input-Output (IO) pin that is connected to a memory device to a predefined level;
   reading a test result corresponding to every IO pin from a second register of the memory I/F, wherein the test result is set with a voltage measurement circuit of the PHY for determining whether the signal voltage at every IO pin has reached an ideal level; and
   storing the test result corresponding to every IO pin in the SRAM, thereby enabling a test host to obtain the test result for each IO pin from the SRAM through the test I/F.

2. The method of claim 1, comprising:
   reporting an error message to the test host through the test I/F when the test result for at least one IO pin that presents an IO error.

3. The method of claim 1, comprising:
   before driving the PHY of the memory I/F, storing the setting to a first register of the memory I/F; and
   reading the test results from a second register of the memory I/F,
   wherein the first register is the same as or different from the second register.

4. The method of claim 1, wherein the memory device is a NAND flash, a NOR flash or a dynamic random access memory (DRAM).

5. The method of claim 1, wherein the memory device comprises a plurality of dies stacked on a substrate, each die is connected to the substrate by a plurality of wires, the processing unit is installed in a controller and the controller is coupled to the memory device through the substrate.

6. The method of claim 1, wherein the setting instructs the PHY to pull-low the signal voltage at every IO pin.

7. The method of claim 1, wherein the setting instructs the PHY to pull-high the signal voltage at every IO pin.

8. The method of claim 1, wherein the setting instructs the PHY to adjust the signal voltage at every IO pin according to a pattern.

9. A non-transitory computer-readable storage medium for verifying a memory interface when executed by a processing unit, wherein the processing unit is coupled to the memory interface (I/F), a static random access memory (SRAM) and a test I/F, the non-transitory computer-readable storage medium comprising program code to:
   store a setting to a first register of the memory I/F to drive a physical layer (PHY) of the memory I/F to pull-high or pull-low a signal voltage at every Input-Output (IO) pin that is connected to a memory device to a predefined level;
   read a test result corresponding to every IO pin from a second register of the memory I/F, wherein the test result is set with a voltage measurement circuit of the PHY for determining whether the signal voltage at every IO pin has reached an ideal level; and
   store the test result corresponding to every IO pin in the SRAM, thereby enabling a test host to obtain the test result for each IO pin from the SRAM through the test I/F.

10. The non-transitory computer-readable storage medium of claim 9, comprising program code to:
   store the setting to a first register of the memory I/F before the PHY of the memory I/F is driven; and
   read the test results from a second register of the memory I/F,
   wherein the first register is the same as or different from the second register.

11. The non-transitory computer-readable storage medium of claim 9, wherein the setting instructs the PHY to pull-low the signal voltage at every IO pin.

12. The non-transitory computer-readable storage medium of claim 9, wherein the setting instructs the PHY to pull-high the signal voltage at every IO pin.

13. The non-transitory computer-readable storage medium of claim 9, wherein the setting instructs the PHY to adjust the signal voltage at every IO pin according to a pattern.

14. An apparatus for verifying a memory interfaces, comprising:
   the memory interface (I/F) comprising a physical layer (PHY);
   a test I/F;
   a static random access memory (SRAM); and
   a processing unit coupled to the SRAM, the memory I/F and the test I/F, arranged to operably store a setting to a first register of the memory I/F to drive the PHY to pull-high or pull-low a signal voltage at every Input-Output (IO) pin that is connected to a memory device to a predefined level; read a test result corresponding to every IO pin from a second register of the memory I/F, wherein the test result is set with a voltage measurement circuit of the PHY for determining whether the signal voltage at every IO pin has reached an ideal level; and store the test result corresponding to every IO pin in the SRAM, thereby enabling a test host to obtain the test result for each IO pin from the SRAM through the test I/F.

15. The apparatus of claim 14, comprising:
   the test host, coupled to the test I/F, arranged to operably obtain the test result for every IO pin from the SRAM through the test I/F.

16. The apparatus of claim 14, wherein the processing unit is arranged operably to store the setting to a first register of the memory I/F before driving the PHY of the memory I/F; and read the test results from a second register of the memory I/F, wherein the first register is the same as or different from the second register.

17. The apparatus of claim 14, wherein the processing unit is arranged to operably to perform at least one of three phases of signal cross tests; pull-low signal voltages of all IO pins of the memory I/F in a first phase; pull-high signal voltages of all IO pins of the memory I/F in a second phase; and pull-high or pull-low a signal voltage of every pin of the memory I/F according to each of a plurality of patterns in a third phase.

18. The apparatus of claim 17, wherein the test results for the IO pins generated in the first, second and third phases are stored in a first, a second and a third regions of the SRAM, respectively, thereby enabling the test host to obtain the test results for the IO pins from a designated region of the SRAM.

19. The apparatus of claim 18, wherein the test results for the IO pins generated in the first, second or third phase are organized in a bitmap, and each bit of the bitmap indicates whether an error has occurred at a corresponding pin of the memory I/F.

20. The apparatus of claim 14, wherein the memory device is a NAND flash, a NOR flash or a dynamic random access memory (DRAM).

* * * * *